US009756758B2

(12) United States Patent
Song

(10) Patent No.: US 9,756,758 B2
(45) Date of Patent: Sep. 5, 2017

(54) TEMPERATURE CONTROL DEVICE AND METHOD AND ELECTRONIC DEVICE

(75) Inventor: Jingshan Song, Shenzhen (CN)

(73) Assignee: ZTE CORPORATION, Shenzhen, Guangdong (CN)

( * ) Notice: Subject to any disclaimer, the term of this patent is extended or adjusted under 35 U.S.C. 154(b) by 317 days.

(21) Appl. No.: 14/384,767

(22) PCT Filed: Apr. 17, 2012

(86) PCT No.: PCT/CN2012/074184
§ 371 (c)(1),
(2), (4) Date: Sep. 29, 2014

(87) PCT Pub. No.: WO2013/134985
PCT Pub. Date: Sep. 19, 2013

(65) Prior Publication Data
US 2015/0060429 A1  Mar. 5, 2015

(30) Foreign Application Priority Data
Mar. 14, 2012 (CN) .......................... 2012 1 0067285

(51) Int. Cl.
*H05K 7/20* (2006.01)
*G05D 23/19* (2006.01)
(Continued)

(52) U.S. Cl.
CPC ........... *H05K 7/20* (2013.01); *G05D 23/1919* (2013.01); *H01L 23/34* (2013.01); *H01L 23/345* (2013.01);
(Continued)

(58) Field of Classification Search
CPC ...... H05K 7/20; G05D 23/1919; H01L 23/34; H01L 23/345; H01L 2924/0002; H01L 2924/00; H05B 3/26
See application file for complete search history.

(56) References Cited

U.S. PATENT DOCUMENTS 8,086,358 B2    12/2011  O'Neil
2007/0216376 A1*  9/2007  Ogawa ................... G01K 3/005
                                                323/236
(Continued)

FOREIGN PATENT DOCUMENTS

CN      1043011 A     6/1990
CN      1055612 A    10/1991
(Continued)

OTHER PUBLICATIONS

International Search Report in international application No. PCT/CN2012/074184, mailed on Dec. 6, 2012.
(Continued)

*Primary Examiner* — Shawntina Fuqua
(74) *Attorney, Agent, or Firm* — Oppedahl Patent Law Firm LLC

(57) ABSTRACT

Provided are a device and method and an electronic device for temperature control, which are used to solve the problem that electronic devices and components cannot operate in a low-temperature state. The temperature control device includes a temperature detection unit (10) configured to detect the operating temperature of a component (16); a heating unit (12) configured to heat the component (16) according to the detection result of the temperature detection unit (10) so that the operating temperature is between a first temperature and a second temperature; and a power supply interface (14) respectively connected to the temperature detection unit (10) and the heating unit (12) and configured to supply power to the temperature detection unit (10) and the heating unit (12). The first temperature is the lower limit value of the operating temperature of the component (16), and the second temperature is the upper limit value of the operating temperature of the component (16). The temperature control device can maintain the operating temperature of an electronic device or a component so that the electronic
(Continued)

device and the component thereof overcome a low-temperature obstacle, thereby operating normally.

11 Claims, 5 Drawing Sheets

(51) Int. Cl.
*H01L 23/34* (2006.01)
*H05B 3/26* (2006.01)

(52) U.S. Cl.
CPC ........ *H05B 3/26* (2013.01); *H01L 2924/0002* (2013.01)

(56) References Cited

U.S. PATENT DOCUMENTS

| | | |
|---|---|---|
| 2008/0124616 A1 | 5/2008 | Miglioranza |
| 2009/0018708 A1 | 1/2009 | O'Neil |
| 2011/0073668 A1 | 3/2011 | Garber |
| 2011/0266356 A1 | 11/2011 | Lin |
| 2012/0005469 A1 | 1/2012 | Jeng |

FOREIGN PATENT DOCUMENTS

| | | |
|---|---|---|
| CN | 1716140 A | 1/2006 |
| CN | 1731531 A | 2/2006 |
| CN | 1767898 A | 5/2006 |
| CN | 1901242 A | 1/2007 |
| CN | 201064028 Y | 5/2008 |
| CN | 201194008 Y | 2/2009 |
| CN | 201402137 Y | 2/2010 |
| CN | 201853148 Y | 6/2011 |
| CN | 202093407 U | 12/2011 |
| DE | 19740169 A1 | 4/1999 |
| EP | 1876511 A2 | 1/2008 |
| EP | 2088639 A1 | 8/2009 |
| JP | 2003216280 A | 7/2003 |
| KG | 1141 C1 | 1/2008 |
| RU | 2041573 C1 | 8/1995 |
| RU | 97887 U1 | 9/2010 |
| TW | 201122750 A1 | 7/2011 |

OTHER PUBLICATIONS

English Translation of the Written Opinion of the International Search Authority in international application No. mailed on Dec. 6, 2012 PCT/CN2012/074184.

Supplementary European Search Report in European application No. 12871425.0, mailed on Dec. 4, 2015.

* cited by examiner

TEMPERATURE CONTROL DEVICE AND METHOD AND ELECTRONIC DEVICE

FIELD

The disclosure relates to the field of electronic devices, and more particularly to a device and method and an electronic device for temperature control.

BACKGROUND

Generally, limited by components including integrated circuits, batteries, and antennae etc., the operating temperature of portable electronic devices is greatly restricted, which leads to abnormal operating states including failures in starting, charging and normal operation, as well as increase in Central Processing Unit (CPU) calculation error rate at low temperature etc. For example tablet computers cannot be charged in low temperature areas because of the low temperature in the winter of 2011. To solve the problem above, the following two methods are applied currently:

(1) increase the external environmental temperature and execute operations including charging or starting etc. after the temperature of electronic devices increases with the environment to a normal operating temperature;

(2) use more advanced components and extend the range of the operating temperature of electronic devices through high-quality materials.

However, the first method fails to solve practical problems, and the second method is not common because high cost may be caused by replacement of components. At the same time, compared with common components, performance improvement of advanced components is limited and the price will be much higher, which results in extremely low cost performance.

Therefore, the problem that an electronic device fails to operate normally due to low temperature exists in the prior art, and there is no ideal solution for the problem at present.

SUMMARY

In view of this, the disclosure is to provide a device and a method and an electronic device for temperature control to solve the problem that an electronic device fails to operate normally due to low temperature in the prior art.

According to one aspect of the disclosure, a temperature control device is provided and the following solution is adopted A temperature control device, configured to maintain the operating temperature of a component of an electronic device, includes: a temperature detection unit, configured to detect the operating temperature of the component; a heating unit, configured to heat the component according to the detection result of the temperature detection unit so that the operating temperature is between a first temperature and a second temperature; and a power supply interface respectively connected to the temperature detection unit and the heating unit and configured to supply power to the temperature detection unit and the heating unit, wherein the first temperature is the lower limit value of the operating temperature of the component, and the second temperature is the upper limit value of the operating temperature of the component.

Further, the temperature control device further includes a control unit, connected to the heating unit and configured to start or close the heating unit according to the detection result of the temperature detection unit.

Further, detecting the operating temperature of the component by the temperature detection unit includes: according to a preset time interval, starting a detection function to detect the operating temperature of the component.

Further, the heating unit is a heating material converting electric energy into heat energy.

Further, the heating material is in a shape of a film covering on the electronic device and/or the component.

Further, the upper limit value of the operating temperature of the heating unit is smaller than the second temperature; the lower limit value of the operating temperature of the heating unit may be smaller than the first temperature.

According to another aspect of the disclosure, an electronic device is provided and the following solution is applied.

An electronic device includes: the temperature control device above, wherein the temperature control device includes a temperature detection unit and a heating unit, wherein the temperature detection unit is provided at a pre-heated component of the electronic device and configured to detect the operating temperature of the component; the heating unit is provided in a reserved space of the electronic device or at the component, and configured to heat the component.

Further, the temperature control device is provided at a first component of the electronic device and configured to control the operating temperature of the first component.

Further, the temperature control device is provided between the first component and a second component of the electronic device, and configured to control the operating temperature of the first component and the second component.

Further, the first component is a printed circuit board made of a heat conduction material; the printed circuit board is a heating equipment of the temperature control device.

Further, the first component further includes a processing module and a storage module; the control unit of the temperature control device is integrated with the first component; the control unit shares the processing module and the storage module with the first component.

According to a third aspect of the disclosure, a temperature control method is provided and the following solution is applied.

A temperature control method, configured to maintain the operating temperature of a component of an electronic device, wherein the temperature control method includes: obtaining the current temperature of the component; determining whether the current temperature is between a first temperature and a second temperature and obtaining a determination result; when the determination result indicates that the current temperature is lower than the first temperature, controlling the current temperature to be between the first temperature and the second temperature, wherein the first temperature is the lower limit value of the operating temperature of the component, and the second temperature is the upper limit value of the operating temperature of the component.

By setting a temperature detection unit and a temperature control unit in the disclosure, the operating temperature of an electronic device or a component can be detected in real time or at intervals, and the temperature of the temperature of the electronic device or component can be adjusted according to the detection result so that the temperature of the electronic device or component is between a preset upper limit value and a preset lower limit value, thus overcoming the problem of abnormal operating states including failures in starting, charging and normal operation, as well as increase in CPU calculation error rate at low temperature etc.

Besides the purposes, features and advantages described above, the disclosure also has other purposes, features and advantages. The disclosure will be further described in details below with reference to drawings.

BRIEF DESCRIPTION OF THE DRAWINGS

The accompanying drawings, which are used for providing further understanding of the disclosure, constitute a part of the application. The exemplary embodiments of the disclosure and the illustrations thereof are used for explaining the disclosure, instead of constituting an improper limitation to the disclosure. In the accompanying drawings.

DETAILED DESCRIPTION

The present application discloses that: the current temperature of a component is obtained; whether the current temperature is between a first temperature and a second temperature is determined and a determination result is obtained; when the determination result indicates that the current temperature is lower than the first temperature, the current temperature between the first temperature and the second temperature is controlled, wherein the first temperature is the lower limit value of the operating temperature of the component, and the second temperature is the upper limit value of the operating temperature of the component.

The embodiments of the disclosure will be described below in combination with the accompanying drawings, but the disclosure may be executed by various different methods limited and covered by the claims.

The first embodiment illustrates the composition, application method and technical effect of a temperature control device through the main structure of a temperature control device.

Figure 1:
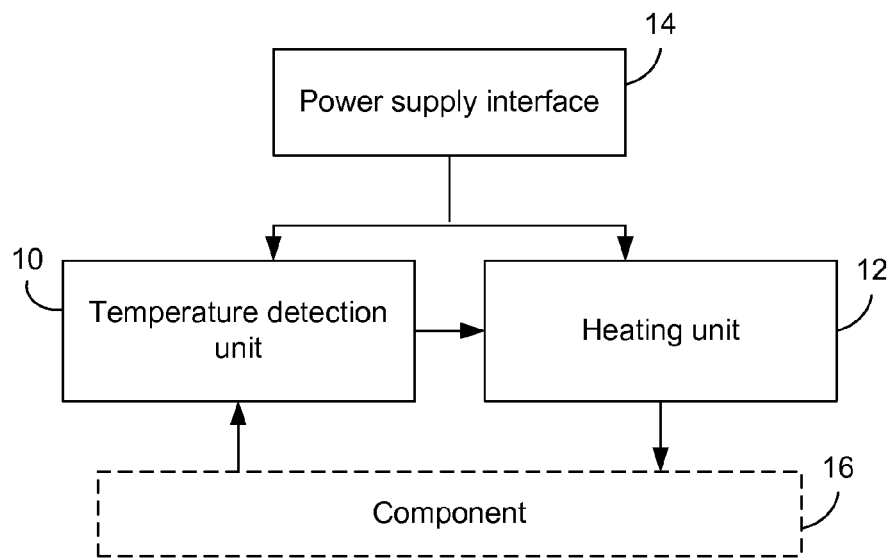
FIG. 1 is a structural diagram of a temperature control device according to the first embodiment of the disclosure.

FIG. 1 shows a structural diagram of a temperature control device according to the first embodiment of the disclosure.

As shown in FIG. 1, the temperature control device includes:

a temperature detection unit 10; the temperature detection unit 10 is connected with a component 16 of an electronic device and configured to detect the operating temperature of the component 16;

a heating unit 12, configured to control, according to the detection result of the temperature detection unit 10, the operating temperature of the component 16 to be between a first temperature and a second temperature; and a power supply interface 14 respectively connected to the temperature detection unit 10 and the heating unit 12 and configured to supply power to the temperature detection unit 10 and the heating unit 12, wherein the first temperature is the lower limit value of the operating temperature of the component 16, and the second temperature is the upper limit value of the operating temperature of the component 16.

The above technical solution of the embodiment illustrates a mobile phone display screen as an example, but is not limited by the mobile phone display screen. Other electronic device components that fail to operate normally at low temperature are also included, e.g. battery chips and CPUs etc. of tablet computers.

The temperature detection unit 10 may be a temperature sensor or other devices capable of measuring temperature. The temperature of the mobile phone display screen is measured by the temperature detection unit 10. Since the operating temperature of the display screen has a lower limit, e.g. the display screen cannot display normally at a temperature below 0° C., then, when detecting that the temperature of the display screen is below 0° C., the temperature detection unit 10 reports the temperature, and starts the heating unit 12 of the temperature control device. After being started, the heating unit 12 heats the display screen and the heated display screen is able to be used normally.

However, the temperature detection unit 10 does not stop working, but starts the detection function at preset intervals, and reports the detection result. According to the detection result, the heating unit 12 starts a heating function, controls a cooling function or closes any function.

The power supply interface 14 provides power for the heating unit 12 and the temperature detection unit 10. The power supply interface 14 may be a power supply socket connected to a rechargeable battery, or may be also a Universal Serial Bus (USB) interface; the electronic device is connected through the USB interface, e.g. a USB interface of a computer, to realize charging.

The second embodiment provides a structural layout of a temperature control device. A heating device is controlled through a control unit 201, and a battery chip of a tablet computer is taken as an example in the second embodiment. However, it is not restrictive to heat a battery chip, other electronic devices and components thereof that fail to operate normally at low temperature are included.

Figure 2:
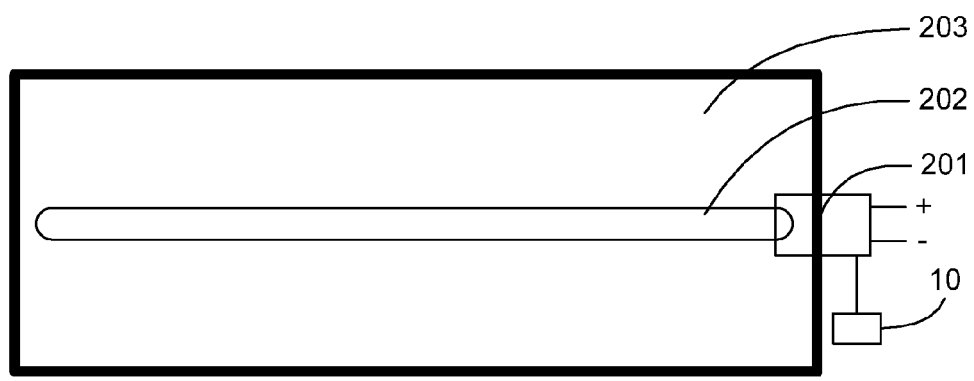
FIG. 2 is a structural diagram of a temperature control device according to the second embodiment of the disclosure.

As shown in FIG. 2, the temperature control device includes a control unit 201 configured to control the heating device 202 to open or close; the heating device 202 is configured to convert electric energy into heat energy; a heat conduction device 203 is made of a material having relatively good heat-conducting property, covering or disposed close to a component that needs to be heated in the operating system.

The heating device 202 and the heat conduction device 203 form a heating unit together.

Since a temperature detection unit 10 should not be put together with the control unit 201 and the heating unit 202 during layout to reduce influence of the heating device 202 on the temperature detection unit 10, the temperature detection unit 10 is connected to the control unit 201 through a wire. They may be disposed at two opposite sides of a component, for example.

Specifically, the lowest temperature required by the heating device 202 to operate normally is lower than the lower limit of the temperature range required by an electronic device or a component to operate normally. The lower limit of the range of the normal operating temperature of the temperature detection unit 10 and the control unit 202 should be lower than the lower limit of the range of the normal operating temperature of a functional component. When heating, the temperature of the heating device 202 should not be higher than the upper limit of the temperature range required by an electronic device to operate normally, otherwise the electronic device may be damaged due to overheating.

The heating device 202 should be able to operate independently from the control unit 201, i.e. when the control unit 201 fails to operate normally, the heating device 202 can still be started to operate normally.

The heating device 202 may be integrated with other functional components, or a printed circuit board may be even directly made of a material having relatively strong heat-conducting capability to act as the heating device 202.

The heating device 202 may be also disposed in a free space of an electronic device and heated so that the temperature of the internal space of the electronic space increases. However, such a method mainly considers that different components have different upper temperature limits, thus an upper heating temperature limit should be worked out over again so that each component of the electronic device can operate normally.

The temperature detection unit 10 should be as close to system functional components as possible and the influence of the heating device 202 on the temperature detection unit 10 should be reduced as much as possible so as to prevent the temperature detection unit 10 from reporting a wrong temperature value due to the measured temperature of the heating device 202 when the temperature of the functional components has not meet the requirement.

The third embodiment takes heating of a power supply chip of a tablet computer as an example. The power supply chip fails to charge normally at a temperature lower than 9° C.

Figure 3:
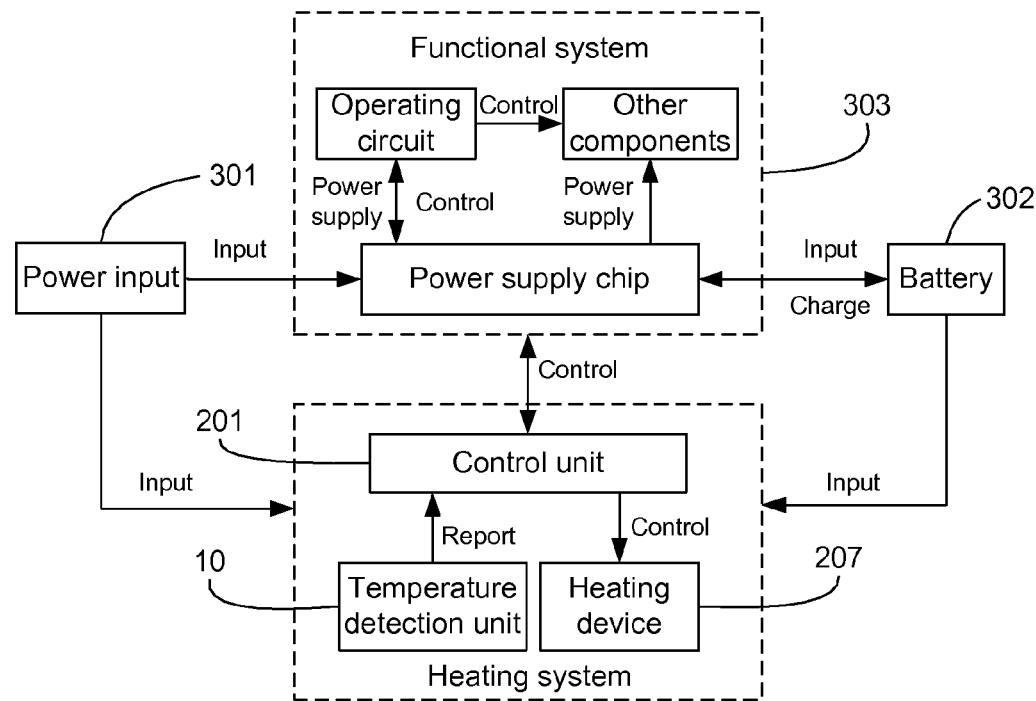
FIG. 3 is a structural diagram of an electronic device according to the third embodiment of the disclosure.

FIG. 3 shows a structural diagram of an electronic device according to the third embodiment of the disclosure.

Referring to FIG. 3, similarly, the embodiment also takes a battery chip as an example. A battery chip is heated, but it is not restrictive to heat a battery chip.

Compared with the first embodiment, a temperature control device further includes a control unit 201. At the same time, the third embodiment shows two power supply methods which can be realized by the temperature control device. By the first method, a battery chip of a functional system 303 can be charged or power to the temperature control device can be supplied by an external power supply 301, e.g. through a USB interface. The second method is to charge e a battery chip of a functional system 203 or supply power to the temperature control device by a battery. A heating unit in the embodiment is a heating device 207. As shown in FIG. 3, the control unit 201 is connected between a temperature detection unit 10 and the heating device 207. The temperature control device is provided at a power supply chip. The power supply chip provides electric power to an operating circuit and other components of the functional system 303. The input of the power supply 301 and charging of a battery 302 will be affected, i.e. a charging failure is caused when the temperature detection unit 10 detects that the temperature of the power supply chip is lower than 9° C., which will affect normal use of the functional system 303. The temperature detection unit 10 reports the current detected temperature of the power supply chip to the control unit 201.

The control unit 201 controls the heating device 207 effectively according to the reported temperature to ensure that the operating temperature of the power supply chip is above 9° C.

Preferably, the heating device 207 may be a material capable of converting electric power into heat power, e.g. heating ceramics, a low temperature electrothermal membrane, a silicon sheet etc. The heating power P=voltage U*voltage U/resistance R. The resistance value of the heating device may be adjusted to adjust the heating power, thus preventing bad heating efficiency caused by low power, or overheating of the device caused by high power.

In the fourth embodiment, a temperature control device is provided in a film shape, and the film-shaped temperature control device is covered on a to-be-heated electronic device or component to adjust the temperature of the electronic device or the component.

Figure 4:
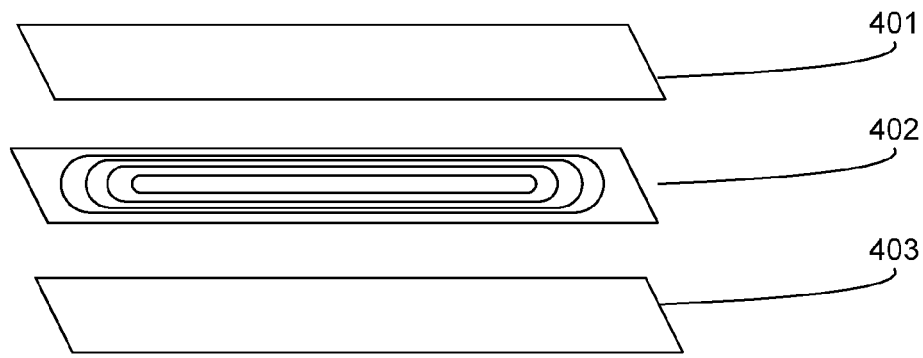
FIG. 4 is a structural diagram of an electronic device according to the fourth embodiment of the disclosure.

FIG. 4 shows a structural diagram of an electronic device according to the fourth embodiment of the disclosure.

An electronic device panel 401, including a front housing, a display screen and a touch screen etc.; this part is the same as the original panel part of the electronic device and any change is unnecessary.

A film-shaped heating device 402 is located between the electronic device panel 401 and a functional processing system 403 of the electronic device and is easy to conduct the heat of the electronic device panel 401 and the functional processing system 403 of the electronic device at the same time.

The functional processing system 403 of the electronic device includes an operating circuit etc. A control unit 201 and a temperature detection unit 10 may be also disposed here.

The film-shaped heating device of the embodiment may also heat only one structure or component, e.g. the electronic device panel 401 is a to-be-heated structure while the functional processing system 403 of the electronic device is replaced by a back cover of the electronic device. In this case, the film-shaped heating device 402 only heats the electronic device panel 401 and may be encapsulated inside the electronic device.

In the embodiment, the heating device, which is provided in a film shape and covers on an electronic device or a component, is convenient to use without affecting the assembly effect of the electronic device.

Preferably, the control unit 201 may be an electronic device or a mechanical device operating independently, and may be also integrated with an operating circuit of a functional system, and may be also integrated with the temperature detection unit 10. After the control unit 201 and the temperature detection unit 10 are integrated, functions of the two may be replaced by a temperature controlled switch.

Embodiment 5 is an embodiment in which a control unit of a temperature control device and an operating circuit of an electronic-device functional system are integrated.

Figure 5:
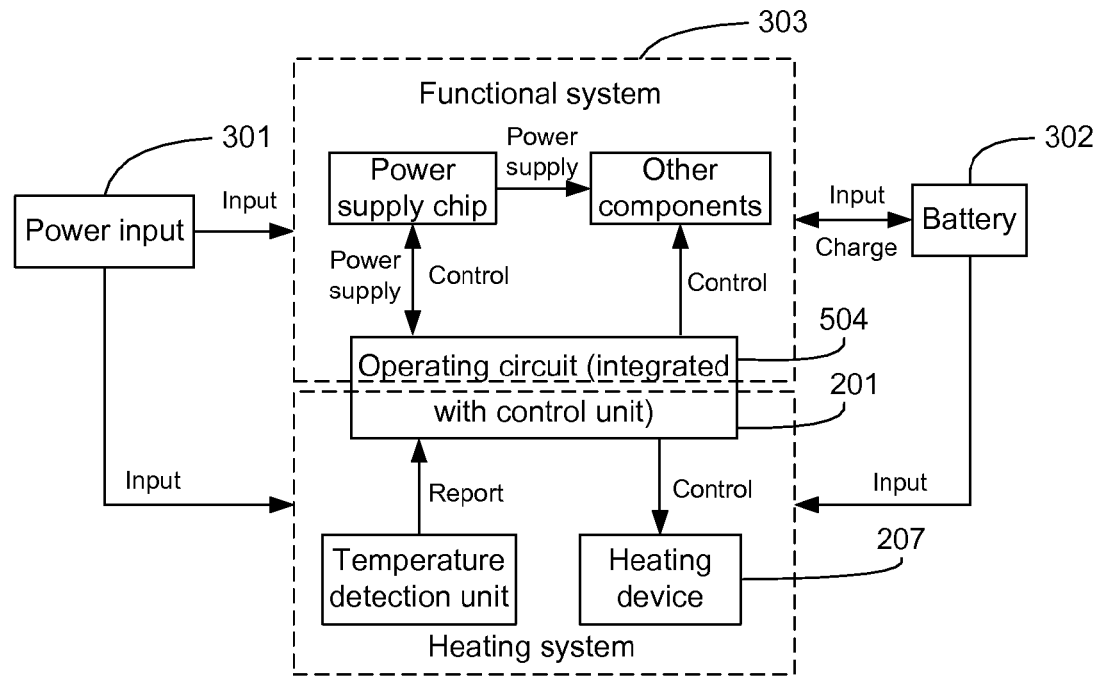
FIG. 5 is a structural diagram of an electronic device according to the fifth embodiment of the disclosure.

FIG. 5 shows a structural diagram of an electronic device according to the fifth embodiment of the disclosure.

The functional system 303 of the electronic device includes an operating circuit 504; the operating circuit 504 and the control unit 201 of the temperature control device are integrated. A Power input 301 and a battery 302 may function as a charging source of a battery chip of the electronic device. The functional system 303 is an operating system of the electronic device, which generally consists of a power supply chip, a control circuit and other related functional components. For example, a functional system of a mobile phone includes a power supply chip, a baseband circuit, a radio frequency circuit, a memory, an antenna, a display screen, a touch screen, and an audio component etc.

A heating system includes a temperature detection unit 10, a heating device 207 and a control unit 201.

The control unit 201 is integrated with the operating circuit 504.

At low temperature, the heating system is configured to improve the temperature of the whole functional system of the electronic device to ensure normal operation of the functional system. The temperature control device can receive a temperature value reported by a temperature detection device and control the starting and closing of the heating device 207. In the embodiment, the control unit 201 and the operating circuit 504 of the functional system 303 are integrated with each other, and can share functional components including a CPU, and a memory etc. to save product manufacturing cost.

Figure 6:
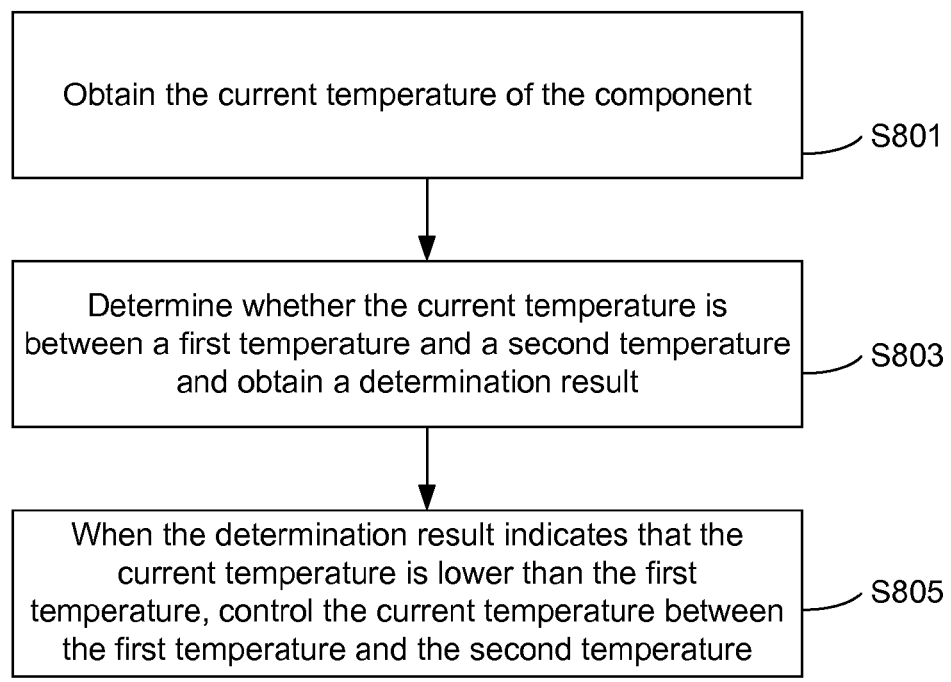
FIG. 6 is a flowchart of a temperature control method according to the sixth embodiment of the disclosure.

FIG. 6 shows a flowchart of a temperature control method according to the sixth embodiment of the disclosure.

As shown in FIG. 6, the temperature control method includes:

Step 801: obtaining the current temperature of the component;

Step 803: determining whether the current temperature is between a first temperature and a second temperature and obtain a determination result;

Step 805: when the determination result indicates that the current temperature is lower than the first temperature, controlling the current temperature to be between the first temperature and the second temperature, wherein the first temperature is the lower limit value of the operating temperature of the component, and the second temperature is the upper limit value of the operating temperature of the component.

In the embodiment, by detecting the temperature of the electronic device and/or the component, the electronic device and/or the component are/is heated or cooled according to the detection result of the temperature of the electronic device and/or the component so that the operating temperature of the electronic device and/or the component is maintained in a range that ensures normal operation.

Figure 7:
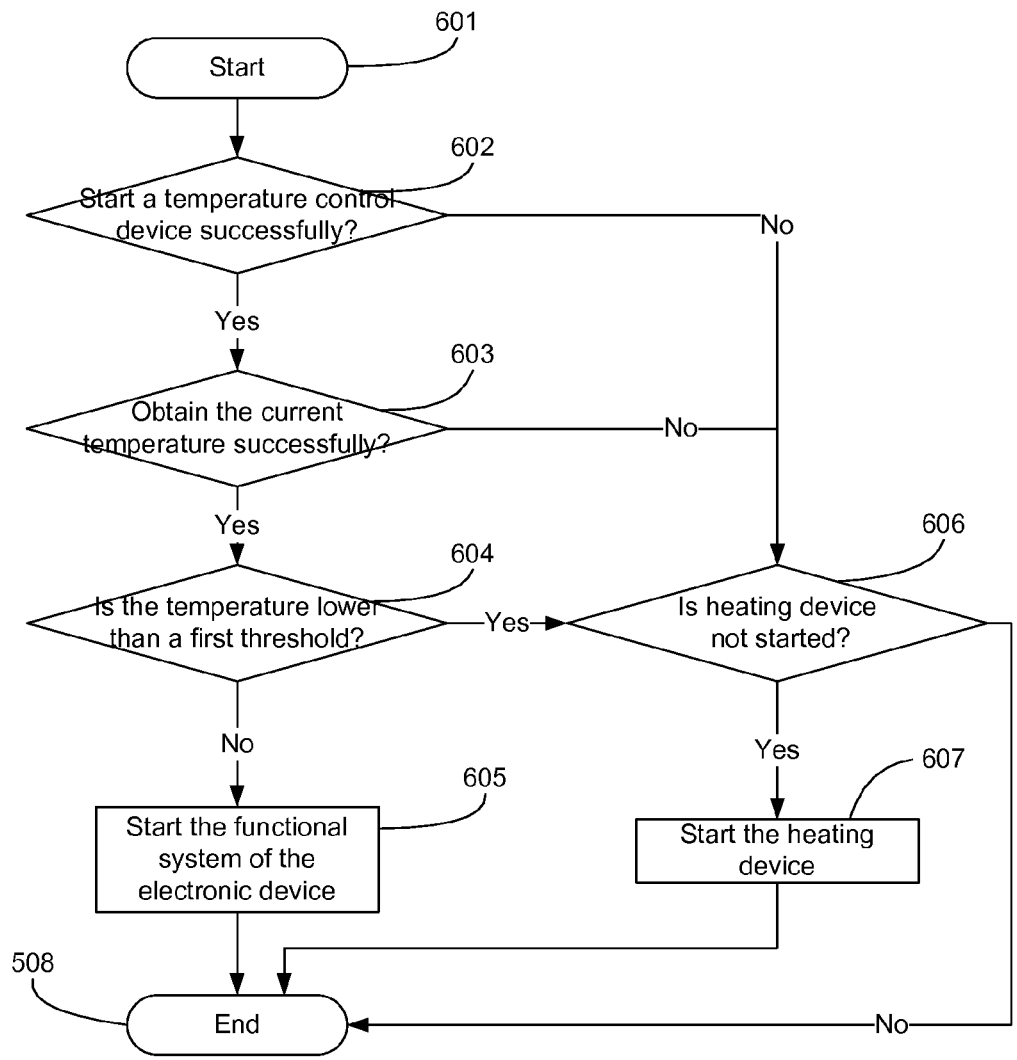
FIG. 7 is a flowchart of a temperature control method according to the seventh embodiment of the disclosure.

FIG. 7 shows a flowchart of a temperature control method according to the seventh embodiment of the disclosure.

As shown in FIG. 7, the temperature control method includes:

Step 601: after receiving a starting signal, entering a starting process; the starting signal may be initiated by pressing a power button by a user, or may be also sent by a control unit after heating for a certain period of time; it can be learned from the flowchart that in the embodiment a control unit can be supported to operate independently from a functional system;

Step 602: starting a control unit; if the current control unit has been started, it can be regarded that this step has been executed successfully;

Step 603: starting the control unit successfully, and obtaining the current temperature by a temperature detection unit;

Step 604: after obtaining the current temperature from the control unit successfully, determining whether the current temperature is lower than a first threshold; the first threshold should be equal to or slightly larger than the lower limit of the temperature range required by an electronic device to operate normally;

Step 605: if it is determined in Step 604 that the temperature is higher than the first threshold, it is regarded that the system can operate normally at the current temperature, then starting the functional system of the electronic device;

Step 606: if the temperature control device is not started successfully in Step 602, it is regarded that the temperature control device fails to operate normally due to over-low temperature; or if the current temperature is not obtained successfully in Step 603, it is regarded that the a temperature detection unit fails to operate normally due to over-low temperature; or if the current temperature is determined to be lower than the first threshold in Step 604 then it is determined that the functional system fails to operate normally. At the moment, entering a heating device starting process, and firstly determining whether a heating device has been started currently. If the heating device has been started, ending the starting process; if the heating device has not been started, entering Step 607;

Step 607: starting the heating device;

Step 608: ending the process; if the functional system is started successfully in the starting process (Step 705) or the temperature control device is not started (Step 602 fails), then the starting process is completely finished; if the temperature control device has been started, but the temperature is not obtained successfully (Step 603 fails) or it is determined that the temperature is lower than the first threshold (Step 604), then it is controlled by the temperature control device to enter the starting process over again in a certain time which refers to the time when the temperature is higher than the first threshold, or after a certain period of time.

Figure 8:
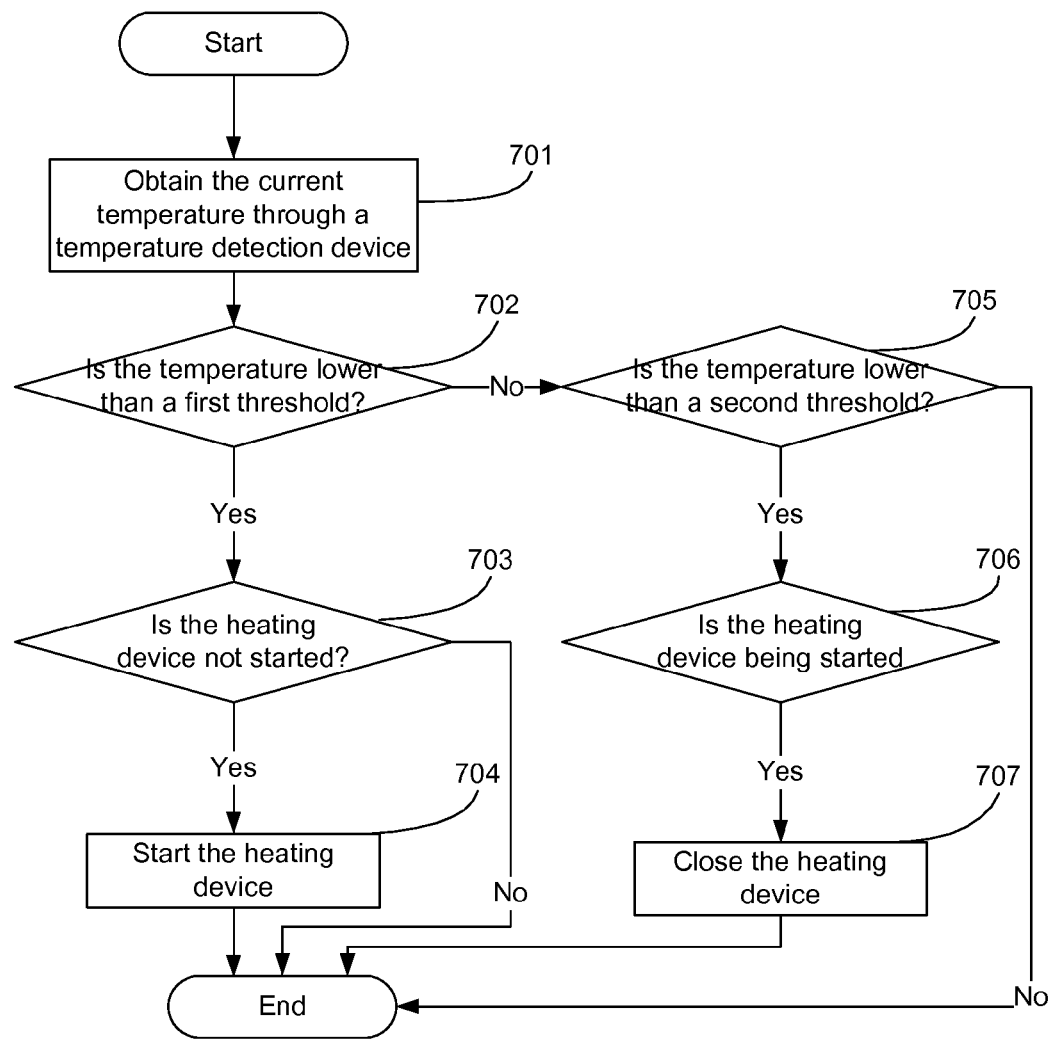
FIG. 8 is a flowchart of a temperature control method of the eighth embodiment of the disclosure.

FIG. 8 shows a flowchart of a temperature control method of the eighth embodiment of the disclosure.

As shown in FIG. 8, the temperature control method includes:

the process will be triggered after a system can operate normally, and a temperature control device and a functional system have been started successfully and can operate normally;

Step 701: obtaining the current temperature by the temperature control device through a temperature detection device;

Step 702: determining whether the current temperature is lower than the first threshold; the first threshold should be equal to or slightly larger than the lower limit of the temperature range required by an electronic device to operate normally;

Step 703: if it is determined in Step 702 that the current temperature is lower than the first threshold, determining that the functional system may operate abnormally; at the moment, entering a heating device starting process, and firstly determining whether a heating device has been started currently; if yes, ending the temperature control process; if no, entering Step 704;

Step 704: starting the heating device;

Step 705: after determining that the current temperature is higher than the first threshold in Step 702, determining whether the current temperature is higher than a second threshold; the second threshold is a temperature value higher than the first threshold, however, the temperature value should not be higher than the upper limit of a temperature range required by the electronic device to operate normally; the temperature difference between the two thresholds is a temperature reduction value generated within a certain period of time when the electronic device operates; if the current temperature is lower than the second threshold, ending the temperature control process;

Step 706: if it is determined that the current temperature is higher than the second threshold in Step 705, it is regarded that the requirement for the functional system to operate normally has been satisfied and the temperature will not drop below the first threshold within a certain period of time, then entering a heating device closing process. Firstly determining whether the heating device is opened currently; if no, there is no need to close the heating device and the temperature control process ends;

Step 707: closing the heating device if it is determined that the heating device is opened in Step 706.

By setting a temperature detection unit and a temperature control unit, in the disclosure the operating temperature of an electronic device or a component can be detected in real time or at intervals, and the temperature of the electronic device or component can be adjusted according to the detection result so that the temperature of the electronic device or component is between a preset upper limit value and a preset lower limit value, thus overcoming the problem of abnormal operating states including failures in starting, charging and normal operation, as well as increase in CPU calculation error rate at low temperature etc.

The aforementioned description is only the embodiments of the disclosure, and is not intended to restrict the patent scope of the disclosure; all equivalent structures or equivalent process variations, which are made by utilizing the specification and the accompany drawing content of the disclosure, or are applied directly or indirectly to the other relevant fields, should be included in the protection scope of the disclosure similarly.

What is claimed is:

1. A temperature control device, configured to maintain an operating temperature of a component of an electronic device, comprising:
    a temperature detection unit, configured to detect the operating temperature of the component;
    a heating unit, configured to heat the component according to a detection result of the temperature detection unit so that the operating temperature is between a first temperature and a second temperature, wherein the heating unit is a heating material converting electric energy into heat energy and the heating material is in a shape of a film covering on the electronic device and/or the component; and
    a power supply interface respectively connected to the temperature detection unit and the heating unit and configured to supply power to the temperature detection unit and the heating unit;
    wherein the first temperature is a lower limit value of the operating temperature of the component, and the second temperature is an upper limit value of the operating temperature of the component.

2. The temperature control device according to claim 1, wherein the temperature control device further comprises:
    a control unit, connected to the heating unit and configured to start or close the heating unit according to the detection result of the temperature detection unit.

3. The temperature control device according to claim 1, wherein detecting the operating temperature of the component by the temperature detection unit comprises:
    according to a preset time interval, starting a detection function to detect the operating temperature of the component.

4. The temperature control device according to claim 1, wherein the upper limit value of the operating temperature of the heating unit is smaller than the second temperature; and the lower limit value of the operating temperature of the heating unit is smaller than the first temperature.

5. An electronic device comprising the temperature control device according to claim 1, wherein the temperature detection unit is provided at the component pre-heated of the electronic device and configured to detect the operating temperature of the component; the heating unit is provided in a reserved space of the electronic device or at the component, and configured to heat the component.

6. The electronic device according to claim 5, wherein the temperature control device is provided at a first component of the electronic device and configured to control the operating temperature of the first component.

7. The electronic device according to claim 5, wherein the temperature control device is provided between the first component and a second component of the electronic device, and configured to control the operating temperature of the first component and the second component.

8. The electronic device according to claim 6, wherein the first component is a printed circuit board made of a heat conduction material, and the printed circuit board is a heating equipment of the temperature control device.

9. The electronic device according to claim 5, wherein the first component further comprises a processing module and a storage module;
    a control unit of the temperature control device is integrated with the first component; the control unit shares the processing module and the storage module with the first component.

10. A temperature control method, configured to maintain an operating temperature of a component of an electronic device, comprising:
    obtaining a current temperature of the component;
    determining whether the current temperature is between a first temperature and a second temperature and obtain a determination result;
    when the determination result indicates that the current temperature is lower than the first temperature, controlling the current temperature to be between the first temperature and the second temperature;
    wherein the first temperature is a lower limit value of an operating temperature of the component, and the second temperature is an upper limit value of the operating temperature of the component, and
    wherein a heating unit is configured to heat the component and/or the electronic device according to the current temperature, to control the current temperature to be between the first temperature and the second temperature, and the heating unit is a heating material converting electric energy into heat energy and is in a shape of a film covering on the electronic device and/or the component.

11. The electronic device according to claim 7, wherein the first component is a printed circuit board made of a heat conduction material, and the printed circuit board is a heating equipment of the temperature control device.

* * * * *